(12) United States Patent
Suzuki

(10) Patent No.: US 12,069,797 B2
(45) Date of Patent: Aug. 20, 2024

(54) ELECTRICAL DEVICE

(71) Applicant: MEIDENSHA CORPORATION, Tokyo (JP)

(72) Inventor: Shota Suzuki, Numazu (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 18/275,896

(22) PCT Filed: Jan. 17, 2022

(86) PCT No.: PCT/JP2022/001259
§ 371 (c)(1),
(2) Date: Sep. 27, 2023

(87) PCT Pub. No.: WO2022/168569
PCT Pub. Date: Aug. 11, 2022

(65) Prior Publication Data
US 2024/0098881 A1 Mar. 21, 2024

(30) Foreign Application Priority Data
Feb. 5, 2021 (JP) ................................. 2021-017009

(51) Int. Cl.
*H05K 1/00* (2006.01)
*H01G 2/08* (2006.01)
(Continued)

(52) U.S. Cl.
CPC ............. *H05K 1/0215* (2013.01); *H01G 2/08* (2013.01); *H01G 2/106* (2013.01); *H05K 7/2039* (2013.01); *H05K 2201/10409* (2013.01)

(58) Field of Classification Search
CPC ............... H05K 1/0215; H05K 7/2039; H05K 2201/10409; H01G 2/08; H01G 2/106
(Continued)

(56) References Cited

U.S. PATENT DOCUMENTS

| 2006/0208660 A1 | 9/2006 | Shinmura et al. | |
| 2012/0033392 A1* | 2/2012 | Golubovic | H02S 40/34 361/752 |
| 2014/0254068 A1* | 9/2014 | Hashikura | H02B 1/56 361/626 |

(Continued)

FOREIGN PATENT DOCUMENTS

| JP | 2001-144488 A | 5/2001 |
| JP | 2002-344177 A | 11/2002 |

(Continued)

OTHER PUBLICATIONS

Decision of Refusal issued in JP Application No. 2021-017009, mailed Jul. 12, 2022, with English translation (8 pages).

(Continued)

*Primary Examiner* — Zhengfu J Feng
(74) *Attorney, Agent, or Firm* — Foley & Lardner LLP

(57) ABSTRACT

An electrical device according to the present invention has a case (1), a metallic heat sink plate (4) disposed an opening portion (OP) of the case and a circuit board (5) arranged on the heat sink plate. The heat sink plate (4) is interposed between a capacitor (2) and the circuit board (5) so that the circuit board (5) is separated from the capacitor (2) by not only the resinous case (1) but also the metallic heat sink plate (4). Thus, electromagnetic space noise generated from the capacitor (2) is shielded or reduced by the metallic heat sink plate (4) whereby a malfunction of the circuit board (5) is prevented from occurring due to electromagnetic space noise generated from the capacitor (2).

2 Claims, 4 Drawing Sheets

(51) Int. Cl.
  *H01G 2/10* (2006.01)
  *H05K 1/02* (2006.01)
  *H05K 7/20* (2006.01)

(58) Field of Classification Search
  USPC .......................................................... 361/709
  See application file for complete search history.

(56) References Cited

U.S. PATENT DOCUMENTS

| | | | |
|---|---|---|---|
| 2015/0201532 A1 | 7/2015 | Soyano | |
| 2015/0230352 A1* | 8/2015 | Hashikura | H05K 5/0213 174/547 |
| 2016/0295683 A1* | 10/2016 | Uchida | H05K 1/0209 |
| 2022/0009428 A1* | 1/2022 | Sumida | H05K 9/0033 |
| 2022/0115854 A1* | 4/2022 | Shimizu | H02G 3/16 |

FOREIGN PATENT DOCUMENTS

| | | |
|---|---|---|
| JP | 2006-262665 A | 9/2006 |
| JP | 2010-181394 A | 8/2010 |
| JP | 2015-201923 A | 11/2015 |
| JP | 2016-116306 A | 6/2016 |
| JP | 2017-011152 A | 1/2017 |
| JP | 2018-170410 A | 11/2018 |
| JP | 2019-208005 A | 12/2019 |
| JP | 2020-089201 A | 6/2020 |
| WO | WO-2014/069406 A1 | 5/2014 |

OTHER PUBLICATIONS

Notice of Reasons for Refusal issued in JP Application No. 2021-017009, mailed Mar. 15, 2022, with English translation (7 pages).

\* cited by examiner

ELECTRICAL DEVICE

FIELD OF THE INVENTION

The present invention relates to an electrical device.

BACKGROUND ART

As an example of a conventional electrical device, known is an electrical device having a case formed of a resin material in a generally rectangular bottomed tubular shape and a capacitor installed in the case as disclosed in the following patent document. In some types of the electrical device, boss portions of e.g. cylindrical shape are formed on an outer bottom surface (an outer surface of a bottom wall) of the case so that a circuit board is attached to the case via the boss portions.

PRIOR ART DOCUMENTS

Patent Documents

Patent Document 1: Japanese Laid-Open Patent Publication No. 2006-262665

SUMMARY OF THE INVENTION

Problems to be Solved by the Invention

In the conventional electrical device, the circuit board is attached to the outer bottom surface of the case as described above. It means that the capacitor and the circuit board are arranged adjacent to each other in a state of being separated only by the bottom wall of the resinous case. In such an arrangement, there is a possibility of a malfunction of the circuit board occurring due to electromagnetic space noise generated from the capacitor.

The present invention has been made in view of the above-mentioned technical problem. It is an object of the present invention to provide an electrical device capable of suppressing a malfunction of a circuit board occurring due to electromagnetic space noise generated from a capacitor.

Means for Solving the Problems

According to one aspect of the present invention, there is provided an electrical device comprising: a case formed in a rectangular parallelepiped shape with base sides thereof having the largest area, one of the base sides being open to define an opening portion, the other of the base sides being closed by a bottom wall; and a capacitor installed in the case, wherein the electrical device further comprises: a heat sink plate made of a metal material and disposed on the opening portion of the case; a fastening part adapted for screw fastening and provided on an outer surface of the heat sink plate; and a circuit board attached by a screw to the fastening part.

In the electrical device according to one aspect of the present invention, the heat sink plate is interposed between the capacitor and the circuit board so that the circuit board is separated from the capacitor by not only the resinous case (bottom wall) but also the metallic heat sink plate. Hence, electromagnetic space noise generated from the capacitor is shielded or reduced by the metallic heat sink plate. A malfunction of the circuit board is therefore prevented from occurring due to electromagnetic space noise generated from the capacitor.

According to another aspect of the present invention, it is preferable that the fastening part comprises a nut made of a metal material.

The use of the metallic nut as the fastening part leads to tight fixing of the circuit board. When the fastening part and the heat sink plate are made of the same metal material, the fastening part can be easily and firmly secured to the heat sink plate by engagement or any other means such as welding.

According to still another aspect of the present invention, it is preferable that: the heat sink plate is electrically connected to a metallic frame by which the electrical device is fixed; a screw through hole is formed in the circuit board so as to allow insertion therethrough of the screw tightened to the nut; and the circuit board has, on a side thereof opposed to the nut, a circuit pattern for grounding provided at a hole edge of the screw through hole.

Since the circuit pattern for grounding is provided at the hole edge of the screw through hole on the side of the circuit board opposed to the nut, there is no need to provide an additional busbar for connection of the grounding circuit pattern to the frame. This leads to a reduction in the number of component parts of the electrical device and a reduction in the number of assembling steps of the electrical device, thereby achieving improved productivity and reduced production cost of the electrical device.

According to yet another aspect of the present invention, it is preferable that: the electrical device is mounted via a metallic frame and comprises a heat dissipation sheet disposed on an outer surface of the bottom wall of the case so that the heat dissipation sheet is interposed between the bottom wall of the case and the metallic frame.

Since the heat dissipation sheet is disposed on the outer surface of the bottom wall of the case and interposed between the bottom wall of the case and the metallic frame, heat of the capacitor installed in the case is dissipated to the frame via the heat dissipation sheet. This allows heat of the capacitor to be dissipated from both sides of the case via the heat sink plate and the heat dissipation sheet, thereby enabling improved cooling of the capacitor.

Effects of the Invention

According to the present invention, electromagnetic space noise generated from the capacitor is shielded or reduced by the metallic heat sink plate whereby a malfunction of the circuit board is prevented from occurring due to electromagnetic space noise generated from the capacitor.

DESCRIPTION OF EMBODIMENTS

Hereinafter, an electrical device according to one embodiment of the present invention will be explained below with reference to the drawings. In the following embodiment of the present invention, the electrical device is embodied as an inverter device of a vehicle in the same manner as conventional ones.

Figure 1:
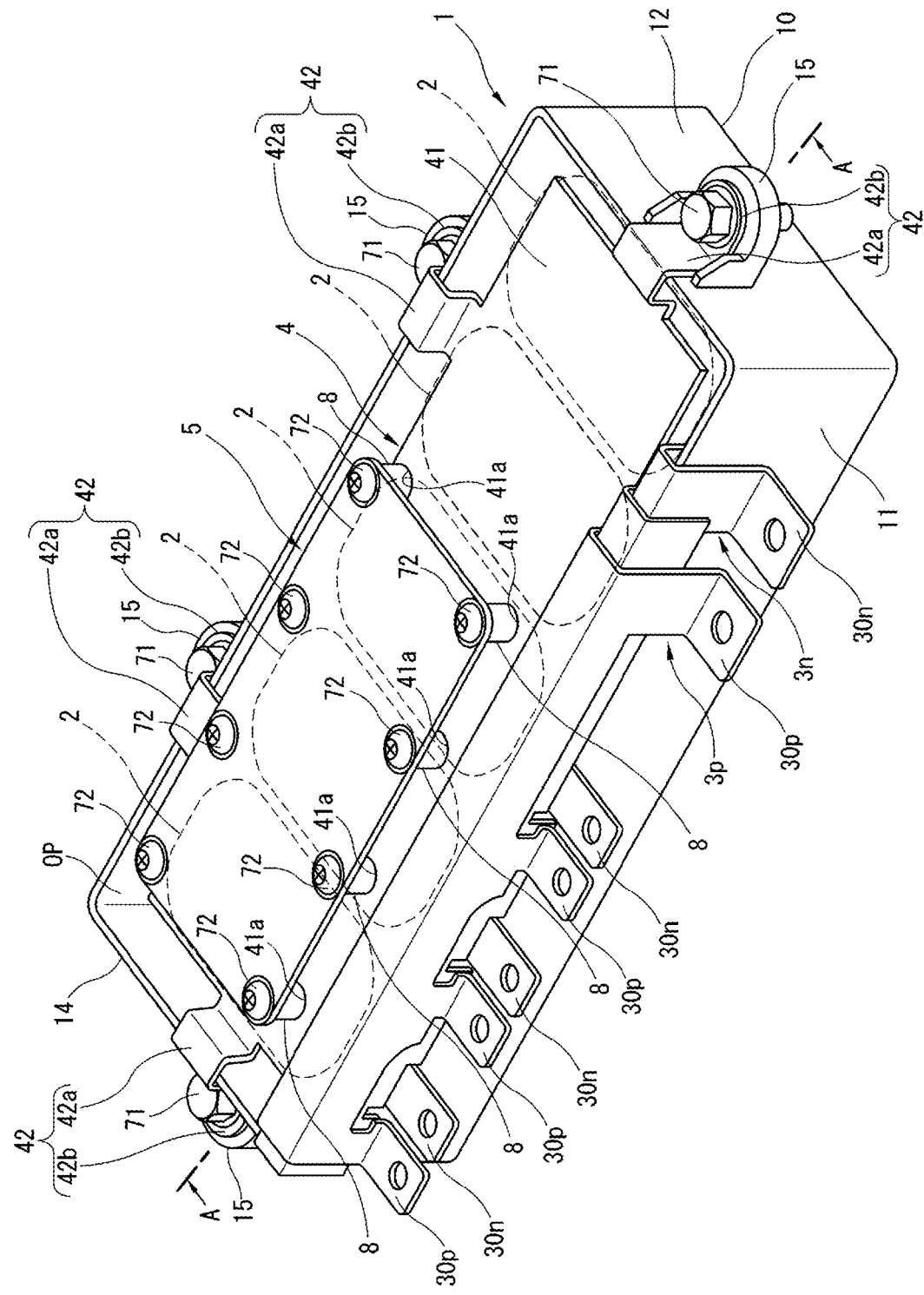
FIG. 1 is a perspective view of an electrical device according to an embodiment of the present invention.
Figure 2:
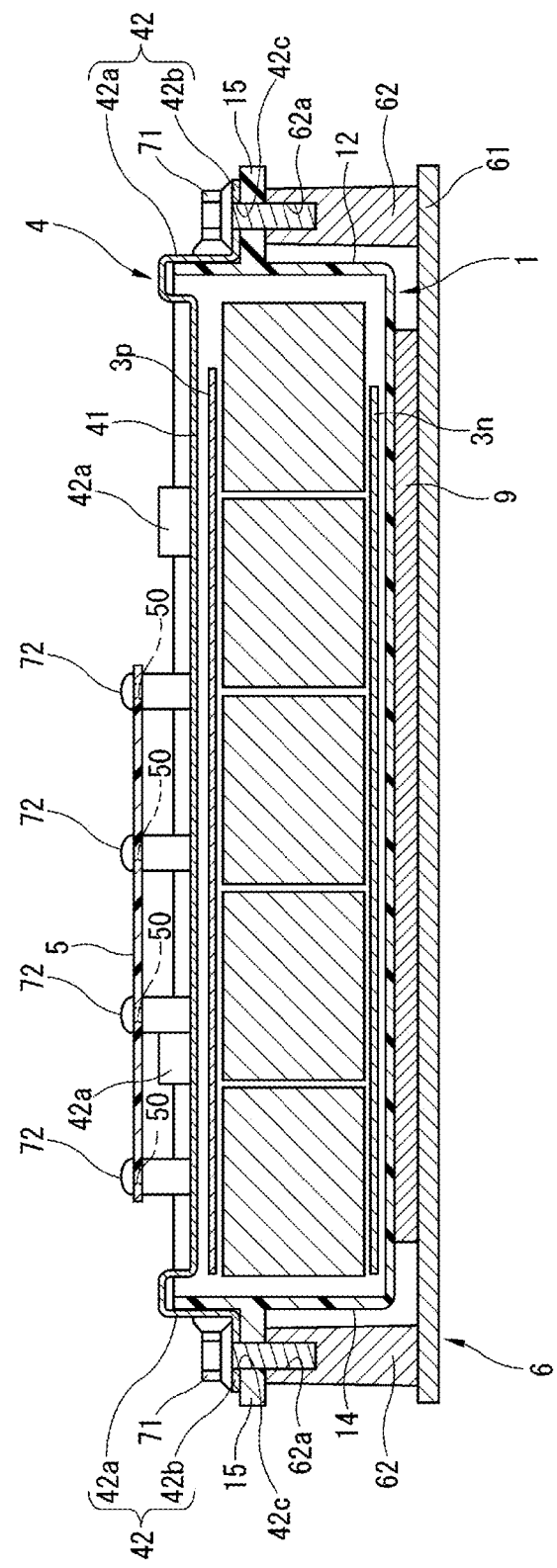
FIG. 2 is a cross-sectional view of the electrical device as taken along line A-A of FIG. 1.

FIG. 1 is a perspective view of the electrical device as viewed diagonally from above. FIG. 2 is a cross-sectional view of the electrical device as taken along line A-A of FIG. 1. In the explanation of each figure, upper and lower sides of the paper are referred to as "upper" and "lower", respectively, for the sake of convenience.

(Configuration of Electrical Device)

As shown in FIGS. 1 and 2, the electrical device according to the present embodiment includes: resinous case 1 having a rectangular bottomed tubular shape; a plurality of capacitors 2 installed in the case 1; and P- and N-busbars 3p and 3n arranged on upper and lower sides of the capacitors 2, respectively. The electrical device according to the present embodiment further includes: a metallic heat sink plate 4 attached to an opening portion OP of the case 1; and a circuit board 5 arranged on an upper side of the heat sink plate 4. The electrical device is fixed via a metallic frame 6 to a body of the vehicle onto which the electrical device is mounted.

The case 1 is integrally formed of a resin material in a rectangular parallelepiped shape with opposite upper and lower base sides thereof having the largest area in such a manner that the upper base side of the case 1 is open to define an opening portion OP and the lower base side of the case 1 is closed by a bottom wall 10. More specifically, the case 1 has a box shape open at the upper side thereof as defined by a bottom wall 10 roughly rectangular in plan view and first, second, third and fourth lateral walls 11, 12, 13 and 14 rising at right angles from respective outer edge sides of the bottom wall 10.

Case-side flange portions 15 for connection to the frame 6 are formed integrally on respective outer surfaces of the second, third and fourth lateral walls 12, 13 and 14 of the case 1 so as to protrude outwardly in parallel with the bottom wall 10. In the present embodiment, one case-side flange portion 15 is provided on each of the outer surfaces of the second and fourth lateral walls 12 and 14 extending along the short sides of the bottom wall 10; and two case-side flange portions 15 are provided on the outer surface of the third lateral wall 13 extending along the long side of the bottom wall 19. Circular case-side bolt insertion holes 15a are formed through the centers of the case-side flange portions 15 such that shafts of bolts 71 are insertable in these bolt insertion holes, respectively.

The capacitors 2 are each provided in the form of a rectangular parallelepiped film capacitor, a circular cylindrical electrolytic capacitor or the like and configured to smooth a direct-current voltage inputted to a semiconductor power module in which one or more semiconductor switching elements (such as IGBT, MOSFET etc.) are installed in one package. In the present embodiment, five generally rectangular parallelepiped film capacitors are arranged in parallel in a longitudinal direction of the case 1 and are connected to the P- and N-busbars 3p and 3n via direct-current input terminals to which a direct-current voltage power source is connected. The capacitors are thus connected to the semiconductor power module via the P- and N-busbars 3p and 3n.

The P- and N-busbars 3p and 3n constitute wiring for power supply to the semiconductor power module. The P-busbar 3p has a plate shape extending in the parallel direction of the capacitors 2 on the upper sides of the capacitors 2 so as to make connection between positive electrode of the power source and the semiconductor power module. On the other hand, the N-busbar 3n has a plate shape extending in the parallel direction of the capacitors 2 on the lower sides of the capacitors 2 so as to make connection between negative electrode of the power source and the semiconductor power module.

In the present embodiment, end portions of the P- and N-busbars 3p and 3n connected to the semiconductor power module are formed in a branched manner as P- and N-terminal portions 30p and 30n which serve as output terminals. Each of the P- and N-terminal portions 30p and 30n is drawn to the outside of the case 1 from the opening portion OP of the case 1. More specifically, the P- and N-terminal portions 30p and 30n are bent in a crank shape from the inside to the outside of the case 1 along an upper end of the first lateral wall 11 (i.e. an edge of the opening portion OP) and are drawn to the outside of the case 1 in such a manner as to extend to outwardly from the first lateral wall 11 in parallel to the case-side flange portions 15 in a state of being alternately arranged side by side in a width direction (longitudinal direction) of the first lateral wall 1.

The heat sink plate 4 has: a heat sink plate body 41 formed in a generally rectangular plate shape; and a plurality of heat-sink-side flange portions 42 extending from three outer edge sides of the heat sink plate body 41 opposed to the second, third and fourth lateral walls 12, 13 and 14. The heat sink plate body 41 and the heat-sink-side flange portions 42 are formed integrally in one piece. Since the heat sink plate 4 performs the function of dissipating heat of the capacitors 2 as will be described later, it is preferable that the heat sink plate 4 is made of a metal material having a relatively high heat dissipation rate.

The heat sink plate body 41 is rectangular-shaped corresponding to the opening area of the opening portion OP of the case 1 and is disposed so as to cover the whole of the upper sides of the capacitors 2 installed in the case 1 and absorb the whole of heat from the capacitors 2.

Nuts 8, each of which is made of a metal material, are provided on an outer surface of the heat sink plate body 41 opposed to and facing the circuit board 5 at positions corresponding to the attachment position of the circuit board 5 (more specifically, the positions of the after-mentioned screw through holes 50) so as to serve as a fastening part for fixing (screw fastening) of the circuit board 5. In the present embodiment, circular nut engagement holes 41a in which the cylindrical column-shaped nuts 8 are engageable are formed through the heat sink plate body 41 at positions corresponding to the attachment position of the circuit board 5 (the positions of the after-mentioned screw through holes 50). The nuts 8 are thus secured to the heat sink plate body 41 by engagement (press-fitting) in the nut engagement holes 41a.

Although the nuts 8 are engaged in the nut engagement holes 41 as mentioned above in the present embodiment, the means of securing the nuts 8 is not limited to engagement of the nuts 8 in the nut engagement holes 41a. It is feasible to secure the nuts 8 to the heat sink plate body 41 by any securing means such as welding. In the case where the nuts 8 are secured by welding to the heat sink plate body 41, there is a merit that the nuts 8 can be easily secured to the heat sink plate body 41 without the need to engage (press-fit) the nuts 8 into the nut engagement holes 41a.

The heat-sink-side flange portions 42 include: bent sections 42a bent in a crank shape from the opening portion OP of the case 1 along the second, third and fourth lateral walls 12, 13 and 14; and attachment sections 42b bent from distal ends of the bent sections 42a outwardly of the case 1 so as to overlap the case-side flange portions 15. Circular heat-sink-side bolt insertion holes 42c are formed in the centers of the attachment sections 42b such that the shafts of the bolts 71 are insertable in these bolt insertion holes, respectively. With the bolts 71 inserted in the heat-sink-side bolt insertion holes 42c of the attachment sections 42b, the heat sink plate 4 is fixed together with the case 1 to the frame 6. In other words, the heat sink plate 4 is electrically connected to the frame 6 via the metallic bolts 71.

The circuit board 5 is generally rectangular plate-shaped and provided with a substrate made of a resin material such as a glass-epoxy resin. The circuit board 5 has, on an inner surface thereof opposed to and facing the heat sink plate 4, a printed circuit pattern and various electronic components such as CPU. Screw through holes 50 are formed through the circuit board 5 at positions along longitudinal edge sides of the circuit board 5 such that metallic screws 72 are insertable in these screw through holes, respectively. (In the present embodiment, four screw through holes are formed along each longitudinal side of the circuit board.) By inserting the screws 72 through the screw through holes 50 and tightening the screws 72 into the nuts 8 on the heat sink plate 4, the circuit board 5 is fixed (screw-fastened) to the heat sink plate 4 via the nuts 8.

Herein, the circuit board 5 has, at a hole edge of at least one of the plurality of screw through holes 50, a pattern for grounding the above-mentioned circuit pattern. When the circuit board 5 is fastened by the screws 72, the grounding pattern is brought into contact with the nut(s) 8 and thereby connected to the frame 6 via the nut(s) 8 and the heat sink plate 4. The frame 6 is grounded by wiring not shown in the figure. With this configuration, the grounding pattern is connected to the ground.

The frame 6 has: a seat portion 61 formed in a generally rectangular plate shape; and a plurality of columnar portions 62 rising perpendicular to the seat portion 61 at positions corresponding to the attachment position of the case 1 on the seat portion 61 (the positions of the case-side flange portions 15). The seat portion 61 and the column portions 62 are formed integrally in one piece. Female thread holes 62a are formed in distal end regions of the column portions 62 such that the shafts of the bolts 71 are engageable in these thread holes, respectively. By screwing the bolts 71 into the female thread holes 62a, the case 1 and the heat sink plate 4 are co-fastened to the frame 6. Since the frame 6 performs the function of dissipating heat of the capacitor 2 as will be described later, it is preferable that the frame 6 is made of a metal material having a relatively high heat dissipation rate as typified by aluminum.

Furthermore, the electrical device includes a heat dissipation sheet 9 having a relatively high heat conductivity arranged on the outer surface of the bottom wall 10 of the case 1 such that the heat dissipation sheet 9 is interposed between the case 1 and the seat portion 61 of the frame 6. By interposing the heat dissipation sheet 8 between the case 1 and the seat portion 61 of the frame 6, heat generated from the capacitor 2 and transferred through the bottom wall 10 of the case 1 can be dissipated via the frame 6.

(Effects of Present Embodiment)

Figure 3:
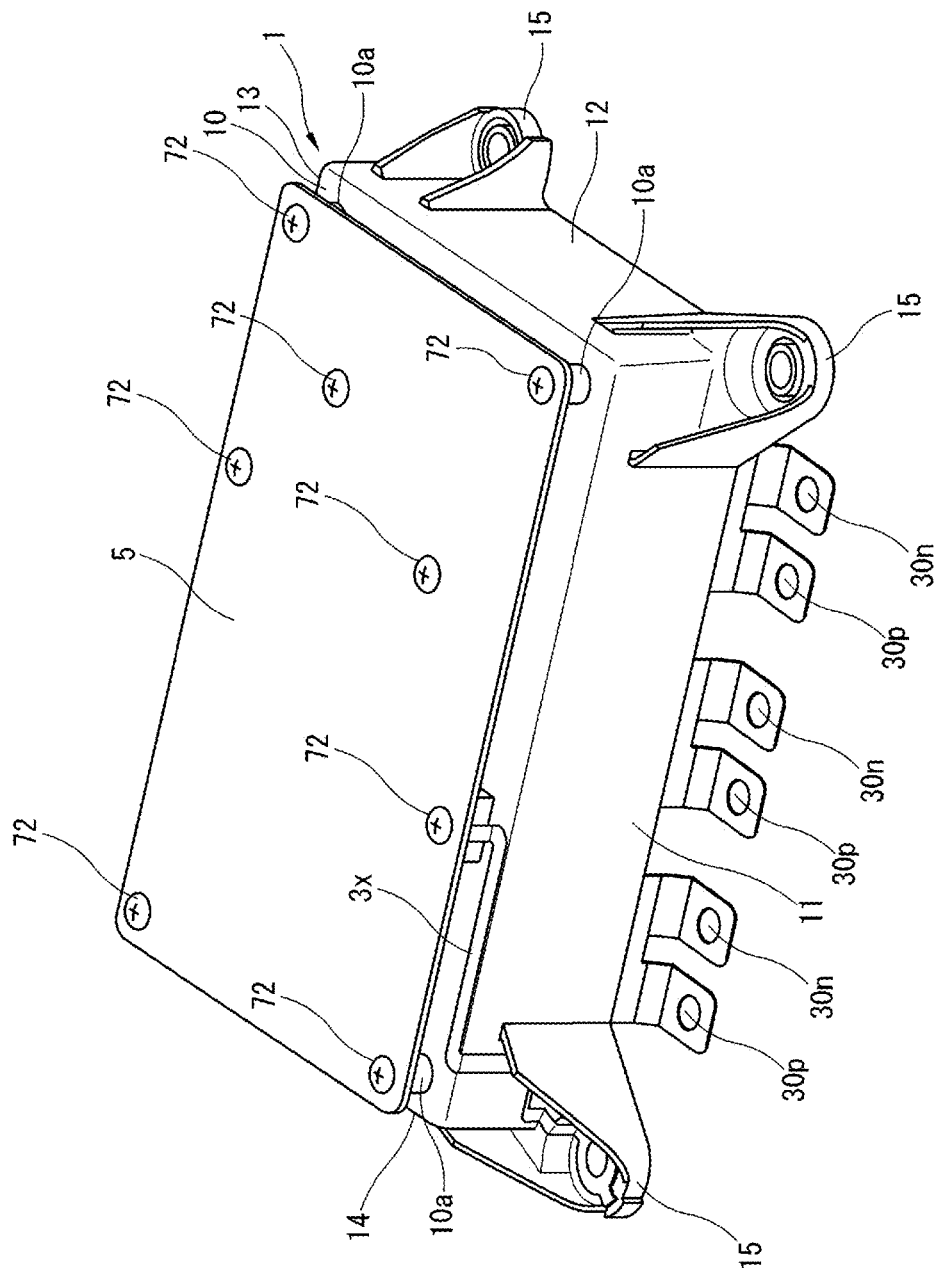
FIG. 3 is a perspective view of a conventional electrical device.
Figure 4:
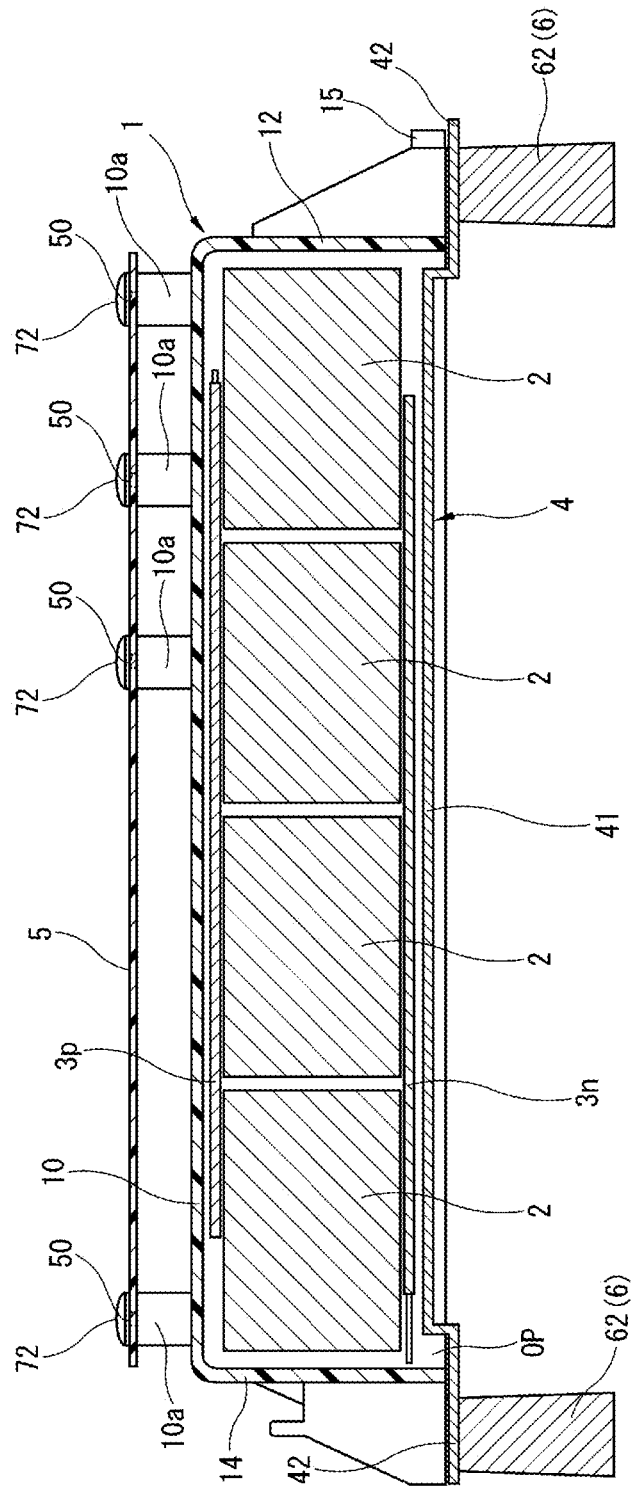
FIG. 4 is a cross-sectional view of the conventional electrical device as taken along line B-B of FIG. 3.

FIG. 3 is a perspective view of a conventional electrical device as viewed diagonally from above. FIG. 4 is a cross-sectional view of the conventional electrical device as taken along line B-B of FIG. 3. In the description of each figure, the upper and lower sides of the paper are referred to as "upper" and "upper", respectively, for the same of convenience.

As shown in FIGS. 3 and 4, the conventional electrical device includes; a rectangular parallelepiped case 1 open at a lower side thereof, with a plurality of boss portions 10a, each of which has a female threaded hole formed therein, provided protrudingly on an outer surface of a bottom wall 10 of the case 1; and a circuit board 5 disposed on distal ends of the boss portions 10a and screw-fastened to the case 1 by inserting shafts of screws 72 through screw through holes 50 of the circuit board and screwing the screws 72 into the female threaded holes of the boss portions 10a.

In the case where the boss portions 10a are provided on respective lateral walls 11 to 14 of the case 1 in the conventional electrical device, the attachment area of the circuit board 5 cannot be sufficiently ensured; and the boss portions 10a have to be formed by molding with a slide mold, which leads to an increase of production cost. For these reasons, the circuit board 5 is screw-fastened to the bottom wall 10 via the boss portions 10a provided on the bottom wall 10 of the largest area, rather than provided on the lateral walls 11 to 14.

In the conventional electrical device in which the circuit board 5 is screw-fastened to the bottom wall 10 of the case 1, however, the capacitor 2 and the circuit board 5 are arranged adjacent to each other in a state of being separated by only the bottom wall 10 of the resinous case 1. There is thus a possibility of a malfunction of the circuit board 5 occurring due to electromagnetic space noise generated from the capacitors 2.

In the present embodiment, by contrast, the circuit board 5 is arranged on the metallic heat sink plate 4 which is disposed on the opening portion OP of the case 1. In other words, the heat sink plate 4 is interposed between the capacitor 2 and the circuit board 5 so that the circuit board 5 is separated from the capacitor 2 by not only the resinous case 1 (bottom wall 10) but also the metallic heat sink plate 4. Hence, electromagnetic space noise generated from the capacitor 2 is shielded or reduced by the metallic heat sink plate 4. A malfunction of the circuit board 5 is therefore prevented from occurring due to electromagnetic space noise generated from the capacitors 2.

Furthermore, the metallic nuts 8 are used as the fastening part for screw fastening of the circuit board 5 in the present embodiment. This enables tight fixing of the circuit board 5. When the nuts 8 as the fastening part and the heat sink plate 4 are made of the same material, the nuts 8 as the fastening part can be easily and firmly secured to the heat sink plate 4 by engagement or any other means such as welding.

In the conventional electrical device, a pattern for grounding a circuit pattern needs to be connected to a frame 6 via a dedicated busbar 3x as shown in FIG. 3 in order to ground electronic components mounted on the circuit board 5. The use of such a dedicated busbar 3x leads to an increase in the number of component parts of the electrical device, which forcibly causes an increase of production cost of the electrical device.

In the present embodiment, by contrast, the nuts 8 are made of the metal material; and the pattern for grounding the circuit pattern is provided at the hole edge of the screw through hole(s) 50 on the surface of the circuit board 5 opposed to and facing the nuts 8. There is thus no need to provide an additional busbar 3x (see FIG. 3) for ground connection of the grounding pattern of the circuit board 5 to the frame 6. This leads to a reduction in the number of component parts of the electrical device and a reduction in the number of assembling steps of the electrical device, thereby achieving improved productivity and reduced production cost of the electrical device.

In the conventional electrical device, heat of the capacitors 2 is dissipated only via the heat sink plate 4 which is disposed on the opening portion OP of the case 1 as shown in FIG. 4. There is thus a possibility that the capacitors 2 may not be cooled sufficiently.

It is conceivable, even in the conventional electrical device, to provide a heat dissipation member such as heat dissipation sheet on the bottom wall 10 side of the case 1 as in the present embodiment. In the conventional electrical device, however, it is difficult to arrange the heat dissipation member such as heat dissipation sheet on the bottom wall side because the circuit board 5 and the boss portions 10a are provided on the bottom wall 10 as shown in FIG. 4.

In the present embodiment, by contrast, the heat dissipation sheet 9 is disposed on the outer surface of the bottom wall 10 of the case 1 and interposed between the bottom wall 10 of the case and the frame 6. Thus, heat of the capacitors 2 is dissipated to the frame 6 via not only the heat sink plate 4 but also the heat dissipation sheet 9. This allows heat of the capacitors 2 to be dissipated from both sides of the case 1 via the heat sink plate 4 and the heat dissipation sheet 9, thereby enabling improved cooling of the capacitors 2.

The present invention is not limited to the configuration of the above-described embodiment. Depending on the specifications of the application target of the present invention, various changes and modifications of the embodiment can be made freely within the range that does not depart from the gist of the present invention.

In the above-described embodiment of the present invention, the electrical device is by way of example embodied as an inverter device in the same manner as conventional one. The present invention is however also applicable to any electrical device other than the inverter device as long as the electrical device has a case 1 formed in a rectangular parallelepiped shape, a capacitor 2 installed in the case 1 and a circuit board 5 fixed to the case 1.

DESCRIPTION OF REFERENCE NUMERALS

1: Case
10: Bottom wall
2: Capacitor
3p: P-busbar
3n: N-busbar
4: Heat sink plate
5: Circuit board
50: Screw insertion hole (Thread insertion hole)
6: Frame
71: Bolt
72: Screw (Thread)
8: Nut (Fastening part)
9: Heat dissipation sheet
OP: Opening portion

The invention claimed is:

1. An electrical device, comprising:
   a case formed in a rectangular parallelepiped shape with base sides thereof having a largest area, a first base side of the base sides being open to define an opening portion, a second base side of the base sides being closed by a bottom wall; and
   a capacitor installed in the case,
   wherein the electrical device further comprises:
   a heat sink plate made of a first metal material and disposed on the opening portion of the case such that an inner surface of the heat sink plate faces the capacitor;
   a fastening part adapted for fastening to a screw and provided on an outer surface of the heat sink plate opposite from the capacitor, the fastening part comprising a nut made of a second metal material; and
   a circuit board attached by the screw fastening to the fastening part,
   wherein the heat sink plate is electrically connected to a metallic frame by which the electrical device is fixed,
   wherein the circuit board has:
      a circuit pattern provided on a pattern surface of the circuit board opposed to the outer surface of the heat sink plate, the pattern surface on which the circuit pattern is provided facing the capacitor with the heat sink plate interposed between the pattern surface and the capacitor;
      a screw through hole formed through the pattern surface so as to allow insertion therethrough of the screw fastened to the nut; and
      a pattern for grounding the circuit pattern, provided at a hole edge of the screw through hole on the pattern surface of the circuit board, and
   wherein an area of the outer surface of the heat sink plate oriented along the opening portion of the case is larger than an area of the pattern surface of the circuit board oriented along the opening portion of the case.

2. The electrical device according to claim 1,
   wherein the electrical device is mounted via the metallic frame, and
   wherein the electrical device comprises a heat dissipation sheet disposed on an outer surface of the bottom wall of the case so that the heat dissipation sheet is interposed between the bottom wall of the case and the metallic frame.

* * * * *